United States Patent
Lin (10) Patent No.: US 7,548,110 B2
(45) Date of Patent: Jun. 16, 2009

(54) POWER AMPLIFIER AND METHOD FOR REDUCING COMMON NOISE OF POWER AMPLIFIER

(75) Inventor: Chung-Wei Lin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 77 days.

(21) Appl. No.: 11/876,779

(22) Filed: Oct. 23, 2007

(65) Prior Publication Data
US 2009/0039957 A1 Feb. 12, 2009

(30) Foreign Application Priority Data
Aug. 9, 2007 (TW) .............................. 96129380 A (51) Int. Cl.
*H03F 3/38* (2006.01)
(52) U.S. Cl. .................. 330/10; 330/149; 330/251; 330/207 A
(58) Field of Classification Search .................. 330/10, 330/149, 251, 207 A
See application file for complete search history.

(56) References Cited

U.S. PATENT DOCUMENTS

| 6,414,614 B1 * | 7/2002 | Melanson ................... 341/143 |
|---|---|---|
| 6,924,757 B2 | 8/2005 | Adams et al. |
| 6,998,910 B2 * | 2/2006 | Hezar et al. .................... 330/10 |
| 7,071,752 B2 * | 7/2006 | Kowkutla et al. ........... 327/291 |
| 7,078,963 B1 * | 7/2006 | Andersen et al. .............. 330/10 |
| 7,078,964 B2 * | 7/2006 | Risbo et al. .................... 330/10 |
| 7,084,799 B1 * | 8/2006 | Butler ......................... 341/143 |
| 2005/0110667 A1 * | 5/2005 | Borisavljevic .............. 341/152 |

* cited by examiner

*Primary Examiner*—Patricia Nguyen
(74) *Attorney, Agent, or Firm*—Jianq Chyun IP Office (57) ABSTRACT

A power amplifier including a delta-sigma modulation module, a differential programmable dead-time-control module, and an output stage module is provided. The delta-sigma modulation module integrates and quantizes an error between a differential-mode input signal and an output signal to generate a first and a second mean signal. The differential programmable dead-time-control module includes a first and a second dead-time-control module which respectively generate a first and a second signal corresponding to the first mean signal and a third and a fourth signals corresponding to the second mean signal through logic calculations. The differential programmable dead-time-control module determines a dead time between the first signal and the second signal according to a first control signal and a dead time between the third signal and the fourth signal according to a second control signal. The output stage module generates the output signal according to the first, second, third, and fourth signal.

21 Claims, 6 Drawing Sheets

POWER AMPLIFIER AND METHOD FOR REDUCING COMMON NOISE OF POWER AMPLIFIER

CROSS-REFERENCE TO RELATED APPLICATION

This application claims the priority benefit of Taiwan application serial no. 96129380, filed on Aug. 9, 2007. All disclosure of the Taiwan application is incorporated herein by reference.

BACKGROUND OF THE INVENTION

1. Field of the Invention

The present invention generally relates to a power amplifier, in particular, to a power amplifier which dynamically adjusts the dead time between signals therein for controlling a switching circuit so as to reduce the common noise thereof.

2. Description of Related Art

Power amplifier plays a very important role in integrated circuit (IC) design, and which is broadly applied to radio communication equipments, transmitters and receivers in television broadcasting, high-fidelity stereo equipments, micro computers, and other electronic equipments. A power amplifier is used for increasing the power of a signal so that the signal can be used for driving a next-level circuit. Accordingly, the performance of a power amplifier is determined by the power gain thereof, wherein the power gain of the power amplifier refers to a ratio of the output power of the power amplifier to the input power of the power amplifier.

The higher the power gain of a power amplifier is, the better performance the power amplifier has. Usually, the power gain curve of a power amplifier has good linearity when the input signal is weak. However, when the input signal is very strong, the power amplifier cannot amplify the input signal linearly, and accordingly the power gain of the power amplifier is reduced. Foregoing phenomenon is referred as gain compression. Along with the increase of an input signal, the later the gain compression of the power amplifier takes place, the higher linearity the power amplifier has. A power amplifier of high linearity has good performance in outputting undistorted signals.

Power amplifiers can be categorized into many different classes, such as class A, class B, class AB, class C, and class D, according to their applications. For example, power amplifiers of class D are broadly applied to audio signal processing in handheld or mobile apparatuses due to the high power conversion efficiency (>90%) thereof. Besides, a pulse width modulator (PWM) may be adopted by a D-class power amplifier for producing continuous pulses, and the pulse width changes along the range of the audio signals, so as to control the operation of a switching circuit in the D-class power amplifier. However, the performance of a D-class power amplifier is not as good as that of an AB-class power amplifier when applied to a product having high demand to signal distortion.

Accordingly, to improve the linearity of an output signal of D-class power amplifier, a sigma-delta D-class power amplifier has been provided. The sigma-delta D-class power amplifier has lower signal distortion compared to AB-class power amplifier and still keeps the high power conversion efficiency of D-class power amplifier. Thus, the sigma-delta D-class power amplifier has high competitiveness in the power amplifier market. However, the sigma-delta D-class power amplifier has a fatal disadvantage, which is, when the input signal is increased to a specific extent (usually, half of a reference level), the total harmonic distortion plus noise (THD+N) of the sigma-delta D-class power amplifier will increase drastically, wherein THD+N is a ratio of the total of harmonic distortion and noise produced by an equipment to the output power of the equipment.

A "sigma delta modulator with reducing switching rate for use in class D amplification" has been disclosed in U.S. Pat. No. 6,924,757. According to this disclosure, the swing of an input signal is detected by an input signal swing detector, and the hysteretic range of a quantizer is determined through table lookup. When an input signal of the sigma delta modulator is increased, the hysteretic range of the quantizer is also increased, and when the input signal is reduced, the hysteretic range of the quantizer is also reduced, so that both the stability and the signal-to-noise ratio (SNR) of the signal are improved.

Since the quantizer has a hysteretic range, the average clock of the sigma delta modulator is reduced, so that the power loss of a switching circuit in a D-class power amplifier (output stage) is reduced and accordingly the performance of the power amplifier in THD+N is improved. However, in the disclosure described above, the swing of the input signal has to be detected first, and then an appropriate hysteretic range is selected through table lookup and converted into a hysteretic control signal by a conversion circuit. Thereby, the complexity, power consumption, and fabrication cost of the system circuit are all increased considerably.

SUMMARY OF THE INVENTION

Accordingly, the present invention is directed to a power amplifier having such advantages as high power conversion efficiency, low signal distortion, and low total harmonic distortion plus noise (THD+N).

The present invention is directed to a method for reducing common noise of a power amplifier, wherein the common noise and THD+N of the power amplifier are reduced by adjusting a dead time between signals for controlling a switching circuit in the power amplifier.

The present invention provides a power amplifier including a delta-sigma modulation module, a differential programmable dead-time control module, and an output stage module. The delta-sigma modulation module receives a differential-mode input signal, and the delta-sigma modulation module integrates and quantizes an error between the differential-mode input signal and an output signal to generate a first mean signal and a second mean signal. The differential programmable dead-time control module is coupled to the delta-sigma modulation module. The differential programmable dead-time control module receives the first mean signal and generates a first signal and a second signal corresponding to the first mean signal through logic calculation, and the differential programmable dead-time control module receives the second mean signal and generates a third signal and a fourth signal corresponding to the second mean signal through logic calculation, and the differential programmable dead-time control module adjusts dead-time corresponding to the first mean signal and the second mean signal respectively. The output stage module is coupled to the differential programmable dead-tine control module and is controlled by the first signal, the second signal, the third signal, and the fourth signal to generate the output signal.

The present invention provides a method for reducing common noise of a power amplifier. First, a differential-mode input signal is received, and an error between the differential-mode input signal and an output signal is integrated and quantized to generate a first mean signal and a second mean signal. Next, a first signal and a second signal corresponding to the first mean signal and a third signal and a fourth signal corresponding to the second mean signal are respectively generated through logic calculations, wherein a dead time between the first signal and the second signal is determined according to a first control signal, and a dead time between the third signal and the fourth signal is determined according to a second control signal. The power amplifier is controlled according to the first signal, the second signal, the third signal, and the fourth signal to generate the output signal.

According to the present invention, a delta-sigma modulation module is adopted for providing a loop response to a circuit system, so as to increase the stability of a signal. Moreover, a differential programmable dead-time control module is adopted for adjusting a dead time between signals for controlling a switching circuit in an output stage module, so as to prevent errors on a differential path caused by process difference and reduce common noise.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
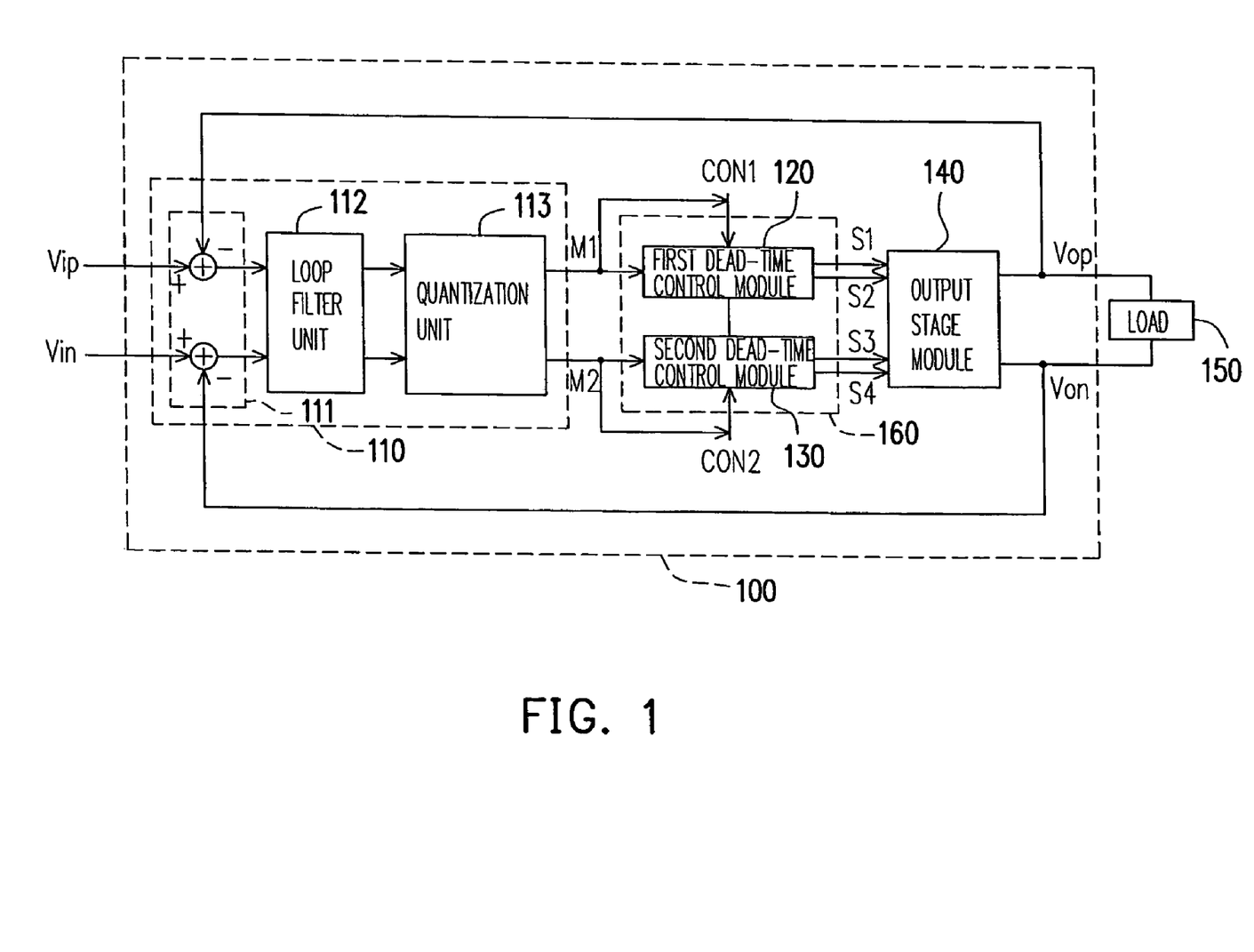
FIG. 1 is a diagram of a power amplifier according to an embodiment of the present invention.

FIG. 1 is a diagram of a power amplifier according to an embodiment of the present invention. Referring to FIG. 1, the power amplifier 100 includes a delta-sigma modulation module 110, a differential programmable dead-time control module 160, and an output stage module 140. The delta-sigma modulation module 110 receives two differential-mode input signals Vip and Vin and respectively integrates and quantizes an error between the differential-mode input signal Vip and an output signal Vop and an error between the differential-mode input signal Vin and an output signal Von to respectively generate a first mean signal M1 and a second mean signal M2. In the present embodiment, the delta-sigma modulation module 110 includes an adder unit 111, a loop filter unit 112, and a quantization unit 113.

The differential programmable dead-time control module 160 adjusts dead-time corresponding to the first mean signal M1 and the second mean signal M2 respectively. The differential programmable dead-time control module 160 includes a first dead-time control module 120 and a second dead-time control module 130. The first dead-time control module 120 is coupled to the delta-sigma modulation module 110 for receiving the first mean signal M1, and the first dead-time control module 120 generates a first signal S1 and a second signal S2 corresponding to the first mean signal M1 through logic calculation, wherein the first dead-time control module 120 determines a dead time between the first signal S1 and the second signal S2 according to a first control signal CON1. Similarly, the second dead-time control module 130 is coupled to the delta-sigma modulation module 110 for receiving the second mean signal M2, and the second dead-time control module 130 generates a third signal S3 and a fourth signal S4 corresponding to the second mean signal M2 through logic calculation, wherein the second dead-time control module 130 determines a dead time between the third signal S3 and the fourth signal S4 according to a second control signal CON2. The output stage module 140 may be a amplifier circuit of class D and which generates output signals Von and Vop for driving a circuit 150 according to a first signal S1, a second signal S2, a third signal S3, and a fourth signal S4.

Figure 2:
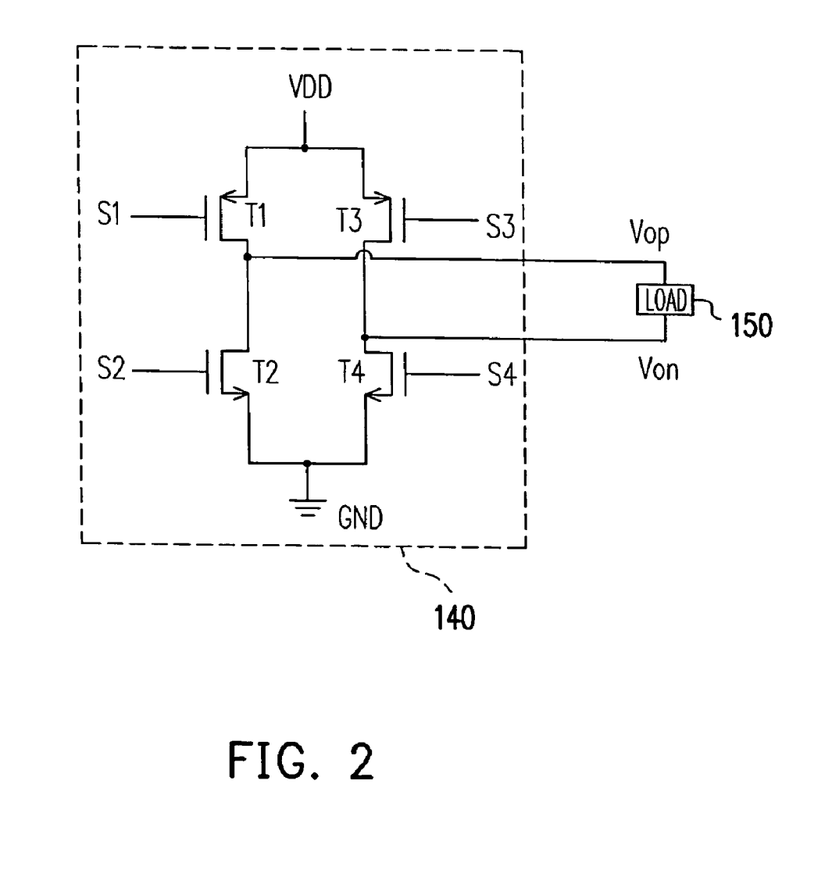
FIG. 2 is a diagram of an output stage module in FIG. 1.

For the convenience of description, the structure of the output stage module 140 will be described herein. FIG. 2 is a diagram of the output stage module 140 in FIG. 1. Referring to FIG. 2, the output stage module 140 includes a first transistor T1, a second transistor T2, a third transistor T3, and a fourth transistor T4, wherein the first transistor T1 and the third transistor T3 are P-type transistors, and the second transistor T2 and the fourth transistor T4 are N-type transistors. The gate of the first transistor T1 receives the first signal S1, and the first source/drain thereof is coupled to a system voltage VDD. The gate of the second transistor T2 receives the second signal S2, the first source/drain thereof is coupled to the second source/drain of the first transistor T1, and the second source/drain thereof is coupled to a ground voltage GND. The gate of the third transistor T3 receives the third signal S3, and the first source/drain thereof is coupled to the first source/drain of the first transistor T1. The gate of the fourth transistor T4 receives the fourth signal S4, the first source/drain thereof is coupled to the second source/drain of the third transistor T3, and the second source/drain thereof is coupled to the second source/drain of the second transistor T2. The second sources/drains of the first transistor T1 and the third transistor T3 in the output stage module 140 respectively generate the output signals Vop and Von for driving the circuit 150.

Figure 3:
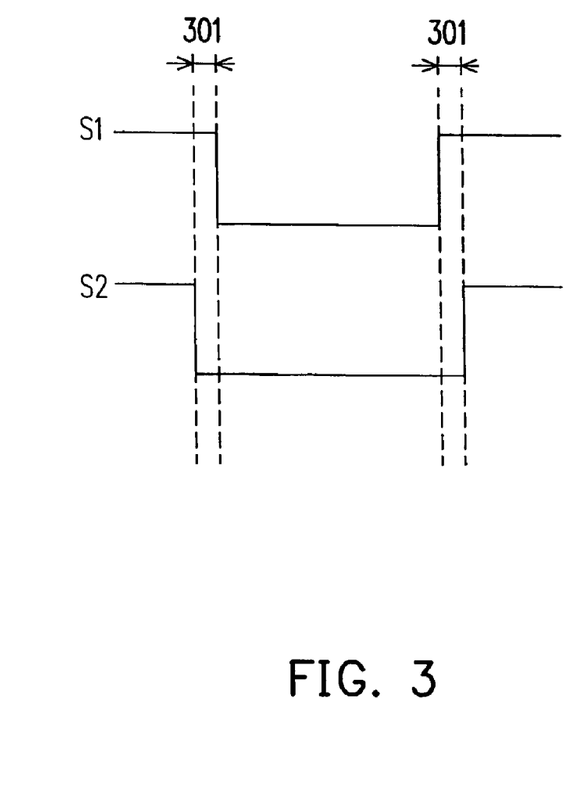
FIG. 3 is a diagram of a dead time.

The first transistor T1 and the second transistor T2 are turned on/off according to respectively the first signal S1 and the second signal S2. The dead time between the first signal S1 and the second signal S2 has to be effectively controlled so as to prevent the first transistor T1 and the second transistor T2 from being turned on at the same time (which may cause the output signal Vop to be unstable). FIG. 3 is a diagram of a dead time. Referring to FIG. 3, during each dead time 301, the first signal S1 and the second signal S2 respectively turn off the first transistor T1 and the second transistor T2. Similarly, the third signal S3 and the fourth signal S4 respectively turn off the third transistor T3 and the fourth transistor T4 during each dead time.

Besides, the output signals Vop and Von may be both at logic high or low level due to improper control of the signals S1~S4, which means the currents of the output signals Vop and Von for driving the circuit 150 take place at the same time. In other words, the common noise of the power amplifier is increased, and the performance of the power amplifier in total harmonic distortion plus noise (THD+N) is reduced. Accordingly, the purpose of the present embodiment is to improve the stability of the output signals Vop and Von and the performance of the power amplifier in THD+N.

Figure 4:
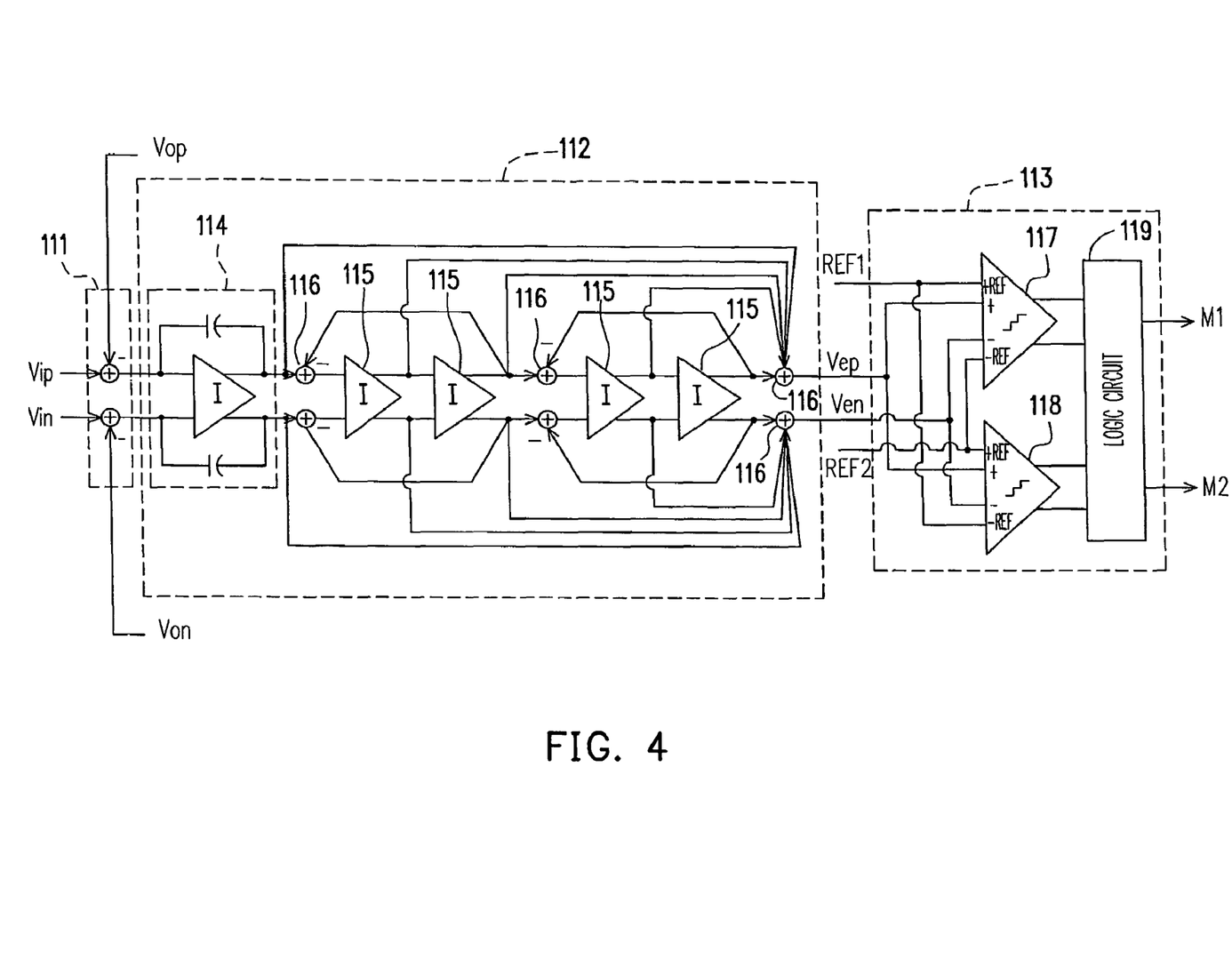
FIG. 4 is a circuit diagram of a delta-sigma modulation module in FIG. 1.

The operation of the delta-sigma modulation module 110 will be described in detail below. The delta-sigma modulation module 110 can be considered as an analog/digital conversion circuit, and which respectively removes noises in the input signals Vip and Vin according to the output signals Vop and Von generated by the output stage module 140 so as to maintain the integrities of the original signals. FIG. 4 is a circuit diagram of the delta-sigma modulation module 110 in FIG. 1. Referring to FIG. 4, the delta-sigma modulation module 110 includes an adder unit 111, a loop filter unit 112, and a quantization unit 113. The adder unit 111 respectively calculates the difference between the input signal Vip and the output signal Vop and the difference between the input signal Vin and the output signal Von.

The loop filter unit 112 is coupled to the adder unit 111 and includes a continuous time integrator 114, a discrete time integrator 115, and an adder 116. The loop filter unit 112 provides a loop response to the power amplifier 100. The loop filter unit 112 accumulates the difference between the input signal Vip and the output signal Vop and the difference between the input signal Vin and the output signal Von and generates two differential-mode error signals Vep and Ven. The quantization unit 113 is coupled to the loop filter unit 112 and quantizes the differential-mode error signals Vep and Ven according to a reference signal REF.

In the present embodiment, the quantization unit 113 is assumed to be a three-level quantizer including a first comparator 117, a second comparator 118, and a logic circuit 119. The first comparator 117 and the second comparator 118 receive the differential-mode error signals Vep and Ven, and the first comparator 117 and the second comparator 118 respectively quantize the differential-mode error signals Vep and Ven according to the level difference between a first reference signal REF1 and a second reference signal REF2 (REF1−REF2) and the level difference between the second reference signal REF2 and the first reference signal REF1 (REF2−REF1). The logic circuit 119 receives the signals output by the first comparator 117 and the second comparator 118 and generates the first mean signal M1 and the second mean signal M2 through logic calculations.

For example, when the differential-mode error signals Vep and Ven are between the system voltage VDD and (REF1−REF2), the first mean signal M1 and the second mean signal M2 are respectively at logic high level (for example, 1) and logic low level (for example, 0). When the differential-mode error signals Vep and Ven are between (REF1−REF2) and (REF2−REF1), the first mean signal M1 and the second mean signal M2 are both at logic low level (for example, 0). In addition, when the differential-mode error signals Vep and Ven are between (REF2−REF1) and the negative system voltage (−VDD), the first mean signal M1 and the second mean signal M2 are respectively at logic low level (for example, 0) and logic high level (for example, 1).

Even the quantization unit 113 is assumed to be a three-level (1.5-bit) quantizer in the present embodiment, the present invention is not limited thereto, and those having ordinary knowledge in the art should be able to adjust the quantization standard of the quantization unit 113, for example, into a 1-bit quantization unit, according to the present disclosure. However, in the present embodiment, the 1.5-bit quantization unit 113 offers higher signal stability than a 1-bit quantization unit.

Figure 5A:
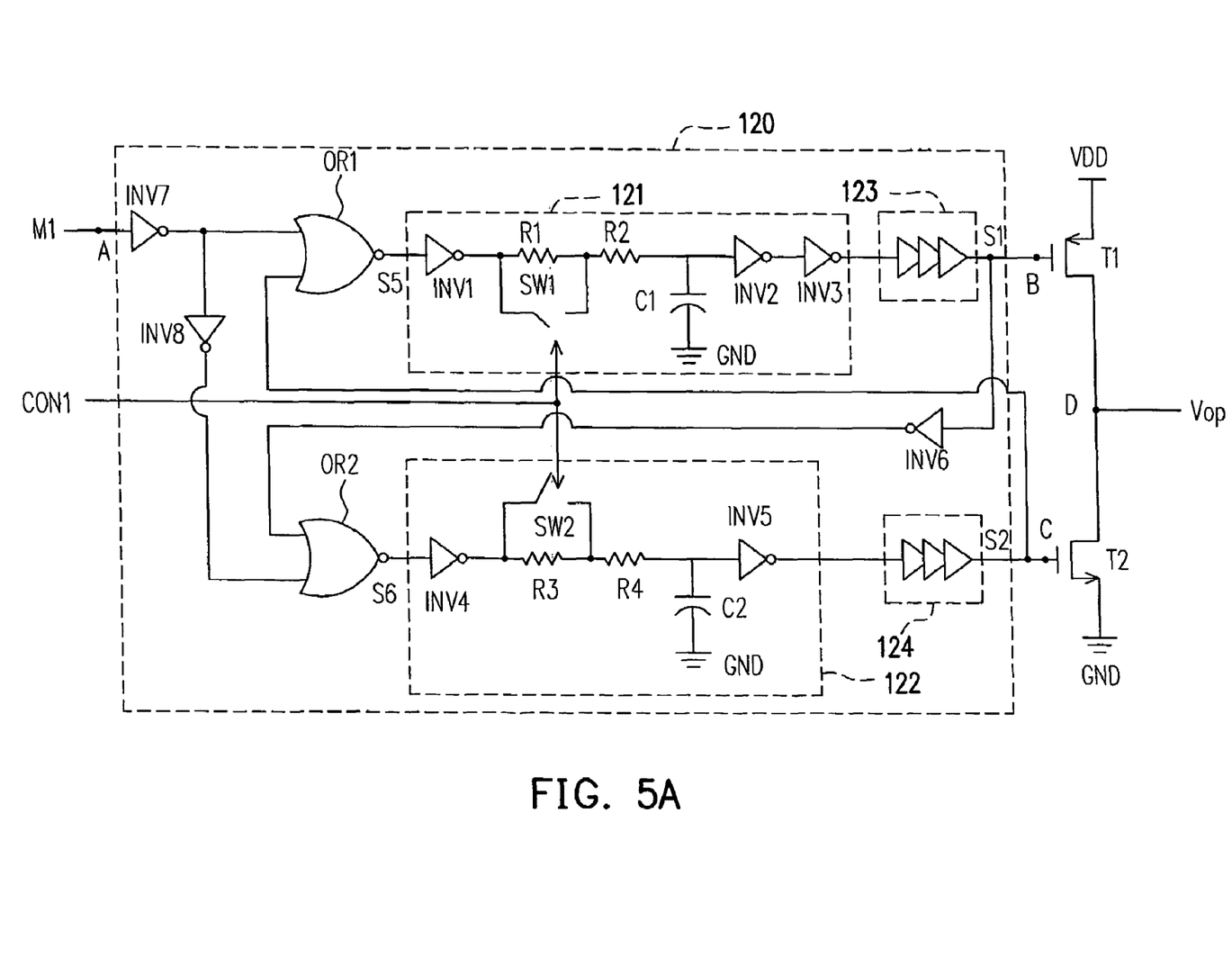
FIG. 5A is a diagram of a first dead-time control module in FIG. 1.

Next, the operation of the differential programmable dead-time control module 160 including the first dead-time control module 120 and the second dead-time control module 130 will be described in detail. FIG. 5A is a diagram of the first dead-time control module 120 in FIG. 1. Referring to FIG. 5A, the first dead-time control module 120 includes a first NOR gate OR1, a second NOR gate OR2, a first delay unit 121, a second delay unit 122, a first buffer unit 123, and a second buffer unit 124. The first NOR gate OR1 receives an inverted signal of the first mean signal M1 (generated by an inverter INV7 based on the first mean signal M1) and the second signal S2 and generates a fifth signal S5. The second NOR gate OR2 receives the first mean signal M1 (generated by inverters INV7 and INV8 based on the first mean signal M1) and an inverted signal of the first signal S1 (generated by an inverter INV6 based on the first signal S1) and generates a sixth signal S6.

The first delay unit 121 coupled to the first NOR gate OR1 delays the fifth signal S5 according to the first control signal CON1 to generate the first signal S1. The second delay unit 122 coupled to the second NOR gate OR2 delays the sixth signal S6 according to the first control signal CON1 to generate the second signal S2. In addition, the first buffer unit 123 and the second buffer unit 124 are respectively coupled to the first delay unit 121 and the second delay unit 122 to increase the intensity of signal transmission.

The first delay unit 121 includes a first inverter INV1, a second inverter INV2, a third inverter INV3, a first resistor R1, a second resistor R2, a first switch SW1, and a first capacitor C1. The input terminal of the first inverter INV1 receives the fifth signal S5. The first and the second terminal of the first resistor R1 are respectively coupled to the output terminal of the first inverter INV1 and the first terminal of the second resistor R2. The first and the second terminal of the first capacitor C1 are respectively coupled to the second terminal of the second resistor R2 and the ground voltage GND. The two terminals of the first switch SW1 are respectively coupled to the first and the second terminal of the first resistor R1 (in parallel), and the first switch SW1 is turned on/off according to the first control signal CON1. The input terminal and the output terminal of the second inverter INV2 are respectively coupled to the second terminal of the second resistor R2 and the input terminal of the third inverter INV3, and the output terminal of the third inverter INV3 generates the first signal S1 through the first buffer unit 123.

The second delay unit 122 includes a fourth inverter INV4, a fifth inverter INV5, a third resistor R3, a fourth resistor R4, a second switch SW2, and a second capacitor C2. The input terminal of the fourth inverter INV4 receives the sixth signal S6. The first and the second terminal of the third resistor R3 are respectively coupled to the output terminal of the fourth inverter INV4 and the first terminal of the fourth resistor R4. The first and the second terminal of the second capacitor C2 are respectively coupled to the second terminal of the fourth resistor R4 and the ground voltage GND. The two terminals of the second switch SW2 are respectively coupled to the first and the second terminal of the third resistor R3 (in parallel), and the second switch SW2 is turned on/off according to the first control signal CON1. The input terminal of the fifth inverter INV5 is coupled to the second terminal of the fourth resistor R4, and the output terminal thereof generates the second signal S2 through the second buffer unit 124.

Figure 5B:
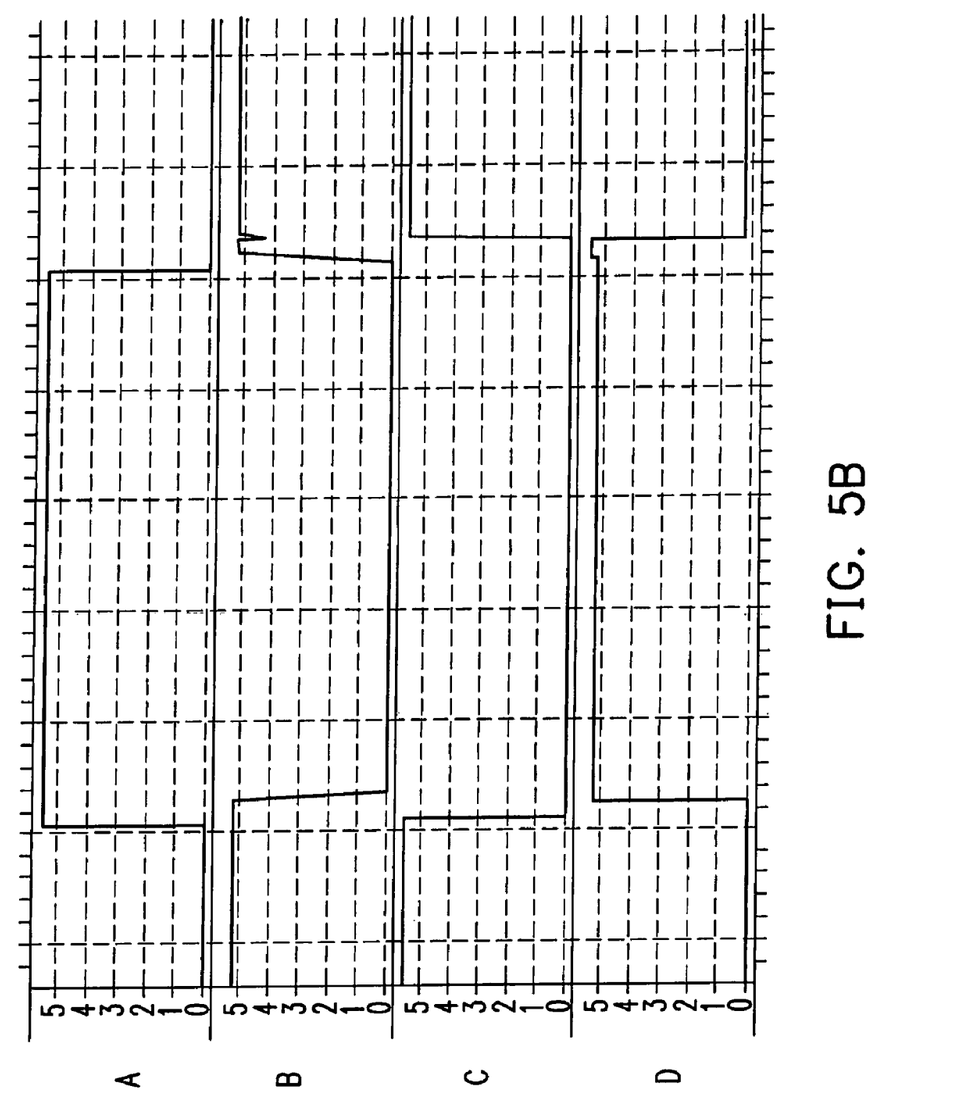
FIG. 5B is a timing diagram of the first dead-time control module in FIG. 1.

FIG. 5B is a timing diagram of the first dead-time control module 120 in FIG. 5A. Nodes A, B, C, and D, which are respectively the first mean signal M1, the first signal S1, the second signal S2, and the output signal Vop, are added into FIG. 5A so that the variations between these signals can be understood clearly. Referring to both FIG. 5A and FIG. 5B, the first switch SW1 and the second switch SW2 are turned on/off according to the first control signal CON1. When the first switch SW1 and the second switch SW2 are turned on, the delay time of the fifth signal S5 and the sixth signal S6 is shorter, and accordingly the dead time between the first signal S1 and the second signal S2 is also shorter. Contrarily, when the first switch SW1 and the second switch SW2 are turned off, the delay time of the fifth signal S5 and the sixth signal S6 is longer, and accordingly the dead time between the first signal S1 and the second signal S2 is also longer.

Accordingly, the first dead-time control module 120 generates the first signal S1 and the second signal S2 corresponding to the first mean signal M1 through logic calculation, and the first dead-time control module 120 determines the dead time between the first signal S1 and the second signal S2 according to the first control signal CON1. The second dead-time control module 130 has the same structure as the first dead-time control module 120 illustrated in FIG. 5A. The second dead-time control module 130 generates the third signal S3 and the fourth signal S4 corresponding to the second mean signal M2 through logic calculation, and the second dead-time control module 130 determines the dead time between the third signal S3 and the fourth signal S4 according to the second control signal CON2.

In addition, as described in the embodiment illustrated in FIG. 2, if the output signals Vop and Von generated by the output stage module 140 are at the same logic level due to improper control of the signals S1~S4, the common noise of the power amplifier may be increased and accordingly the performance of the power amplifier in THD+N may be reduced. Thus, in the present embodiment, the first control signal CON1 and the second control signal CON2 are respectively assumed to be the first mean signal M1 and the second mean signal M2 generated by the delta-sigma modulation module 110.

Since a 1.5-bit quantization unit 113 is adopted in the present embodiment, the logic states of the first mean signal M1 and the second mean signal M2 have three different combinations, which are respectively (M1=1, M2=0), (M1=0, M2=0), and (M1=0, M2=1). If the first dead-time control module 120 and the second dead-time control module 130 operate separately, the dead time between the first signal S1 and the second signal S2 generated by the first dead-time control module 120 is controlled by the first mean signal M1, and the dead time between the third signal S3 and the fourth signal S4 generated by the second dead-time control module 130 is controlled by the second mean signal M2. If the first dead-time control module 120 and the second dead-time control module 130 operate at the same time, the logic states of the first mean signal M1 and the second mean signal M2 have different combinations which can also be used for adjusting the time of the output signals Vop and Von converting the logic levels thereof and accordingly reducing the common noise of the power amplifier.

Figure 6:
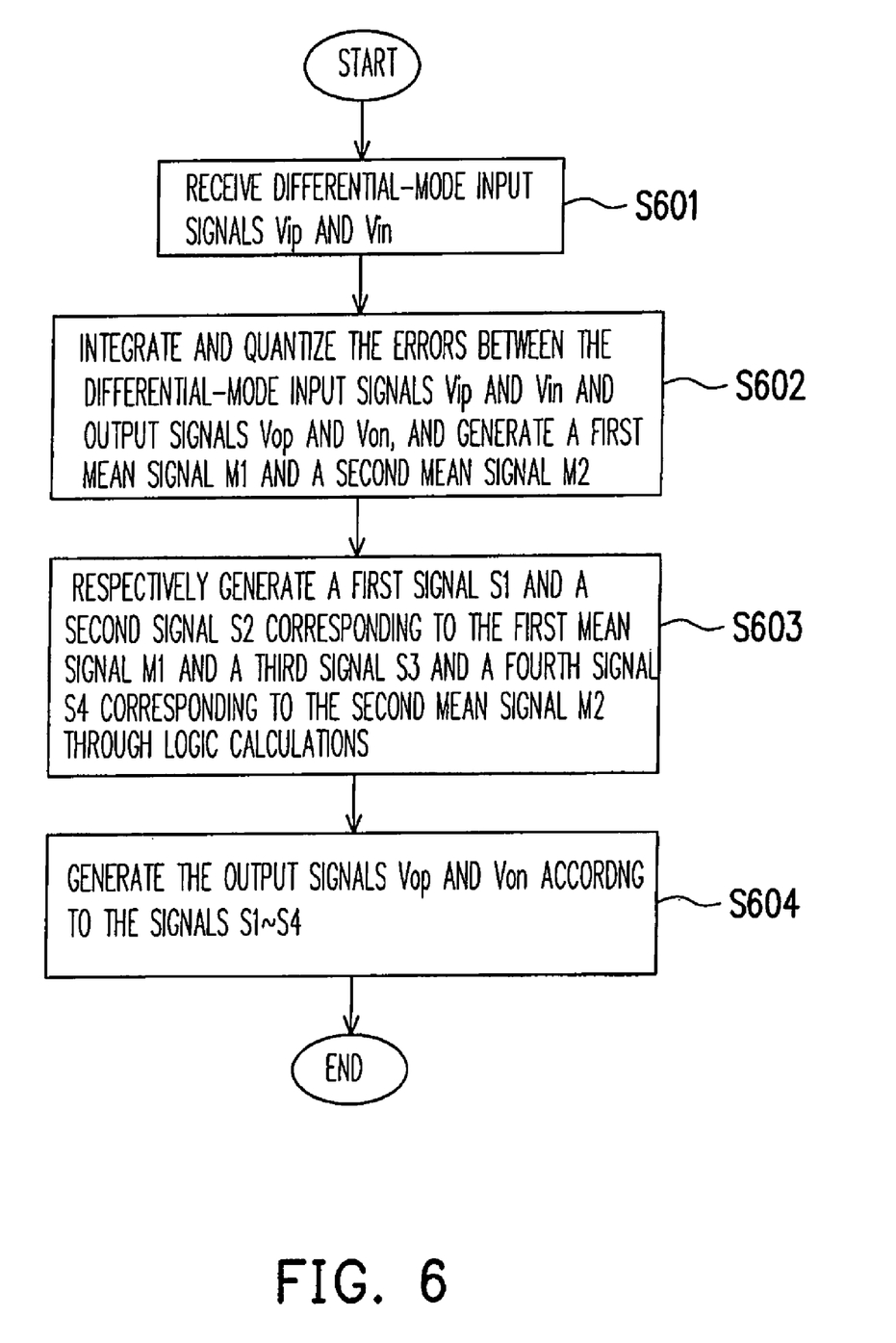
FIG. 6 is a flowchart illustrating a method for reducing common noise of a power amplifier according to an embodiment of the present invention.

Even though the first control signal CON1 and the second control signal CON2 have been assumed to be respectively the first mean signal M1 and the second mean signal M2 in foregoing description, the present invention is not limited thereto. The first control signal CON1 and the second control signal CON2 may also be control signals provided externally. According to the embodiments described above, a method for reducing common noise of a power amplifier can be deduced. FIG. 6 is a flowchart illustrating a method for reducing common noise of a power amplifier according to an embodiment of the present invention. Referring to FIG. 6, first, the differential-mode input signals Vip and Vin are received (step S601). As illustrated in FIG. 4, the errors between the differential-mode input signals Vip and Vin and the output signals Vop and Von are respectively integrated and quantized to generate the first mean signal M1 and the second mean signal M2 (step S602).

As illustrated in FIG. 5A, the first signal S1 and the second signal S2 corresponding to the first mean signal M1 are generated through logic calculation, and the third signal S3 and the fourth signal S4 corresponding to the second mean signal M2 are generated through logic calculation (step S603), wherein the dead time between the first signal S1 and the second signal S2 is controlled by the first control signal CON1, and the dead time between the third signal S3 and the fourth signal S4 is controlled by the second control signal CON2. Finally, as illustrated in FIG. 2, the power amplifier is controlled to generate the output signals Vop and Von according to the signals S1~S4 (step S604).

In overview, according to the present invention, a delta-sigma modulation module 110 is adopted for providing a loop response to the circuit system, and a differential programmable dead-time control module 160 (including a first dead-time control module 120 and a second dead-time control module 130) is adopted for adjusting the dead time between a first signal S1 and a second signal S2 and the dead time between a third signal S3 and a fourth signal S4 for controlling a switching circuit in the output stage module 140, so as to prevent errors on a differential path caused by process difference, reduce the common noise of a power amplifier, and improve the performance of the power amplifier in THD+N. The first dead-time control module 120 and the second dead-time control module 130 are implemented with simple logic circuits therefore the complexity and power consumption of the power amplifier are both reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power amplifier, comprising:
   a delta-sigma modulation module, receiving a differential-mode input signal, integrating and quantizing an error between the differential-mode input signal and an output signal, and generating a first mean signal and a second mean signal;
   a differential programmable dead-time control module, coupled to the delta-sigma modulation module, the differential programmable dead-time control module receiving the first mean signal and generating a first signal and a second signal corresponding to the first mean signal through logic calculation, and the differential programmable dead-time control module receiving the second mean signal and generating a third signal and a fourth signal corresponding to the second mean signal through logic calculation and the differential programmable dead-time control module adjusts dead-time corresponding to the first mean signal and the second mean signal respectively; and
   an output stage module, coupled to the differential programmable dead-time control module, the output stage module being controlled by the first signal, the second signal, the third signal, and the fourth signal to generate the output signal to drive a load.

2. The power amplifier according to claim 1, wherein the differential programmable dead-time control module comprises:

a first dead-time control module, receiving the first mean signal, and generating the first signal and the second signal corresponding to the first mean signal through logic calculation, wherein the first dead-time control module determines a dead time between the first signal and the second signal according to a first control signal; and a second dead-time control module, receiving the second mean signal, and generating the third signal and the fourth signal corresponding to the second mean signal through logic calculation, wherein the second dead-time control module determines a dead time between the third signal and the fourth signal according to a second control signal.

3. The power amplifier according to claim 2, wherein the first dead-time control module comprises:

a first NOR gate, receiving the second signal and an inverted signal of the first mean signal, and generating a fifth signal;

a second NOR gate, receiving the first mean signal and an inverted signal of the first signal, and generating a sixth signal;

a first delay unit, coupled to the first NOR gate for receiving the fifth signal, delaying the fifth signal according to the first control signal, and generating the first signal; and a second delay unit, coupled to the second NOR gate for receiving the sixth signal, delaying the sixth signal according to the first control signal, and generating the second signal.

4. The power amplifier according to claim 3, wherein the first dead-time control module further comprises:

a first buffer unit, coupled to the first delay unit; and
a second buffer unit, coupled to the second delay unit.

5. The power amplifier according to claim 3, wherein the first delay unit comprises:

a first inverter, having an input terminal for receiving the fifth signal;

a first resistor, having a first terminal coupled to an output terminal of the first inverter;

a second resistor, having a first terminal coupled to a second terminal of the first resistor;

a first capacitor, having a first terminal coupled to a second terminal of the second resistor and a second terminal coupled to a ground voltage;

a first switch, having two terminals respectively coupled to the first terminal and the second terminal of the first resistor, and the first switch being turned on/off according to the first mean signal;

a second inverter, having an input terminal coupled to the second terminal of the second resistor; and a third inverter, having an input terminal coupled to an output terminal of the second inverter and an output terminal for generating the first signal.

6. The power amplifier according to claim 3, wherein the second delay unit comprises:

a fourth inverter, having an input terminal for receiving the sixth signal;

a third resistor, having a first terminal coupled to an output terminal of the fourth inverter;

a fourth resistor, having a first terminal coupled to a second terminal of the third resistor;

a second capacitor, having a first terminal coupled to a second terminal of the fourth resistor, and a second terminal coupled to a ground voltage;

a second switch, having two terminals respectively coupled to the first terminal and the second terminal of the third resistor, the second switch being turned on/off according to the first control signal; and a fifth inverter, having an input terminal coupled to the second terminal of the fourth resistor and an output terminal for generating the second signal.

7. The power amplifier according to claim 2, wherein the second dead-time control module comprises:

a first NOR gate, receiving the fourth signal and an inverted signal of the second mean signal, and generating a fifth signal;

a second NOR gate, receiving the second mean signal and an inverted signal of the third signal, and generating a sixth signal;

a first delay unit, coupled to the first NOR gate for receiving the fifth signal, delaying the fifth signal according to the second control signal, and generating the third signal; and a second delay unit, coupled to the second NOR gate for receiving the sixth signal, delaying the sixth signal according to the second control signal, and generating the fourth signal.

8. The power amplifier according to claim 7, wherein the second dead-time control module further comprises:

a first buffer unit, coupled to the first delay unit; and
a second buffer unit, coupled to the second delay unit.

9. The power amplifier according to claim 7, wherein the first delay unit comprises:

a first inverter, having an input terminal for receiving the fifth signal;

a first resistor, having a first terminal coupled to an output terminal of the first inverter;

a second resistor, having a first terminal coupled to a second terminal of the first resistor;

a first capacitor, having a first terminal coupled to a second terminal of the second resistor and a second terminal coupled to a ground voltage;

a first switch, having two terminals respectively coupled to the first terminal and the second terminal of the first resistor, the first switch being turned on/off according to the second control signal;

a second inverter, having an input terminal coupled to the second terminal of the second resistor; and a third inverter, having an input terminal coupled to an output terminal of the second inverter and an output terminal for generating the third signal.

10. The power amplifier according to claim 7, wherein the second delay unit comprises:

a fourth inverter, having an input terminal for receiving the sixth signal;

a third resistor, having a first terminal coupled to an output terminal of the fourth inverter;

a fourth resistor, having a first terminal coupled to a second terminal of the third resistor;

a second capacitor, having a first terminal coupled to a second terminal of the fourth resistor and a second terminal coupled to a ground voltage;

a second switch, having two terminals respectively coupled to the first terminal and the second terminal of the third resistor, the second switch being turned on/off according to the second control signal; and a fifth inverter, having an input terminal coupled to the second terminal of the fourth resistor and an output terminal for generating the fourth signal.

11. The power amplifier according to claim 2, wherein the first control signal is the first mean signal, and the second control signal is the second mean signal.

12. The power amplifier according to claim 2, wherein the first control signal and the second control signal are external control signals.

13. The power amplifier according to claim 1, wherein the delta-sigma modulation module comprises:
an adder unit, calculating an error between the differential-mode input signal and the output signal;
a loop filter unit, coupled to the adder unit for accumulating the error, and generating a differential-mode error signal; and
a quantization unit, coupled to the loop filter unit, quantizing the differential-mode error signal, and generating the first mean signal and the second mean signal.

14. The power amplifier according to claim 13, wherein the quantization unit is a three-level quantizer, and the quantization unit comprises:
a first comparator, receiving the differential-mode error signal, and quantizing the differential-mode error signal according to a level difference between a first reference signal and a second reference signal;
a second comparator, receiving the differential-mode error signal, and quantizing the differential-mode error signal according to a level difference between the second reference signal and the first reference signal; and
a logic circuit, receiving signals output by the first comparator and the second comparator and generating the first mean signal and the second mean signal through logic calculation.

15. The power amplifier according to claim 1, wherein the output stage module comprises:
a first transistor, having a gate for receiving the first signal and a first source/drain coupled to a system voltage;
a second transistor, having a gate for receiving the second signal, a first source/drain coupled to a second source/drain of the first transistor, and a second source/drain coupled to a ground voltage;
a third transistor, having a gate for receiving the third signal and a first source/drain coupled to the first source/drain of the first transistor; and
a fourth transistor, having a gate for receiving the fourth signal, a first source/drain coupled to a second source/drain of the third transistor, and a second source/drain coupled to the second source/drain of the second transistor;
wherein the second sources/drains of the first transistor and the third transistor generate the output signal.

16. A method for reducing common noise of a power amplifier, comprising:
receiving a differential-mode input signal;
integrating and quantizing an error between the differential-mode input signal and an output signal to generate a first mean signal and a second mean signal;
generating a first signal and a second signal corresponding to the first mean signal through logic calculation, wherein a dead time between the first signal and the second signal is determined according to a first control signal;
generating a third signal and a fourth signal corresponding to the second mean signal through logic calculation, wherein a dead time between the third signal and the fourth signal is determined according to a second control signal; and
controlling the power amplifier to generate the output signal according to the first signal, the second signal, the third signal, and the fourth signal.

17. The method according to claim 16, wherein the step of generating the first mean signal and the second mean signal comprises:
calculating an error between the differential-mode input signal and the output signal;
accumulating the error, and generating a differential-mode error signal; and
quantizing the differential-mode error signal, and generating the first mean signal and the second mean signal through logic calculation.

18. The method according to claim 16, wherein the step of generating the first signal and the second signal corresponding to the first mean signal through logic calculation comprises:
performing an OR operation on the second signal and an inverted signal of the first mean signal to generate a fifth signal;
performing a NOR operation on the first mean signal and an inverted signal of the first signal to generate a sixth signal;
delaying the fifth signal according to the first control signal to generate the first signal; and
delaying the sixth signal according to the first control signal to generate the second signal.

19. The method according to claim 16, wherein the step of generating the third signal and the fourth signal corresponding to the second mean signal through logic calculation comprises:
performing a OR operation on the fourth signal and an inverted signal of the second mean signal to generate a fifth signal;
performing a NOR operation on the second mean signal and an inverted signal of the third signal to generate a sixth signal;
delaying the fifth signal according to the second control signal to generate the third signal; and
delaying the sixth signal according to the second control signal to generate the fourth signal.

20. The method according to claim 16, wherein the first control signal is the first mean signal, and the second control signal is the second mean signal.

21. The method according to claim 16, wherein the first control signal and the second control signal are external control signals.

* * * * *